United States Patent [19]

Thiessen

[11] Patent Number: 5,097,476
[45] Date of Patent: Mar. 17, 1992

[54] LASER SENSOR WITH EXTERNAL RESONANCE CAVITY

[75] Inventor: Rainer Thiessen, Müchen, Fed. Rep. of Germany

[73] Assignee: Polytec GmbH & Co., Waldbronn, Fed. Rep. of Germany

[21] Appl. No.: 558,065

[22] Filed: Jul. 25, 1990

[51] Int. Cl.$^5$ .............................. H01S 3/08
[52] U.S. Cl. ...................... 372/92; 372/20; 372/26; 372/28; 372/29; 372/32; 372/97; 372/99
[58] Field of Search ............... 372/18, 20, 26, 28, 372/29, 97, 99, 1, 32

[56] References Cited

U.S. PATENT DOCUMENTS

| | | | |
|---|---|---|---|
| 3,676,799 | 7/1972 | Danielmeyer | 372/32 |
| 3,686,585 | 8/1972 | Javan et al. | 372/32 |
| 3,713,042 | 1/1973 | Kinsel | 372/32 X |
| 3,793,595 | 2/1974 | Russo et al. | 372/32 |
| 3,921,099 | 11/1975 | Abrams et al. | 372/32 |
| 4,452,533 | 6/1984 | Miles et al. | 356/352 |
| 4,583,227 | 4/1986 | Kirkby | 372/32 |
| 4,644,556 | 2/1987 | Petuchowski | 372/94 |
| 4,773,077 | 9/1988 | Yamamoto | 372/92 |
| 4,803,692 | 2/1989 | Sakano | 372/50 |
| 4,803,695 | 2/1989 | Yamamoto | 372/92 |
| 4,806,778 | 2/1989 | Yamamoto | 250/561 |
| 4,829,531 | 5/1989 | Kawanishi | 372/19 |
| 5,020,901 | 6/1991 | de Groot | 356/5 |

FOREIGN PATENT DOCUMENTS 0140820  5/1985  European Pat. Off.

OTHER PUBLICATIONS

Investigation of Tunable Single Frequency Diode Lasers for Sensor Applications, E. M. Strzelecki etc., Journal of Lightwave Tech. vol. 6, No. 10, Oct. 1988, pp. 1610–1618.

An External Cavity Diode Laser Sensor, Ronald O. Miles, etc. Journal of Lightwave Tech. vol. 1, Mar. 1988 pp. 81–93.

*Primary Examiner*—Georgia Y. Epps
*Attorney, Agent, or Firm*—Fishauf, Holtz, Goodman & Woodward

[57] ABSTRACT

A semiconductor laser HL has an external resonator including a reflector R which reflects the emitted laser beam back into the front facet of the laser. The light emitted from the rear facet of the laser falls on a photodiode PD which generates a signal s which is evaluated by an evaluation unit AE. By differentiation or other processing of the shapes of pulses in the signal s, it is possible to determine the direction of change of any of several operating parameters of the laser system, such as the length L between laser HL and reflector R, the tilt angle of reflector R with respect to the optical axis of the laser or the refractive index n of the medium in the space N defined between the laser and the reflector. For example, one can detect when gas G is fed into space N to change the medium from ordinary air to carbon dioxide, or the reverse. Further, by modulation of one of the operating parameters, such as the pumping current I of the laser, one can measure the time- or phase-shift of the pulses in signal s with respect to the modulation. Further, the pumping current can be corrected to minimize temperature sensitivity of any of the components of the system.

22 Claims, 4 Drawing Sheets

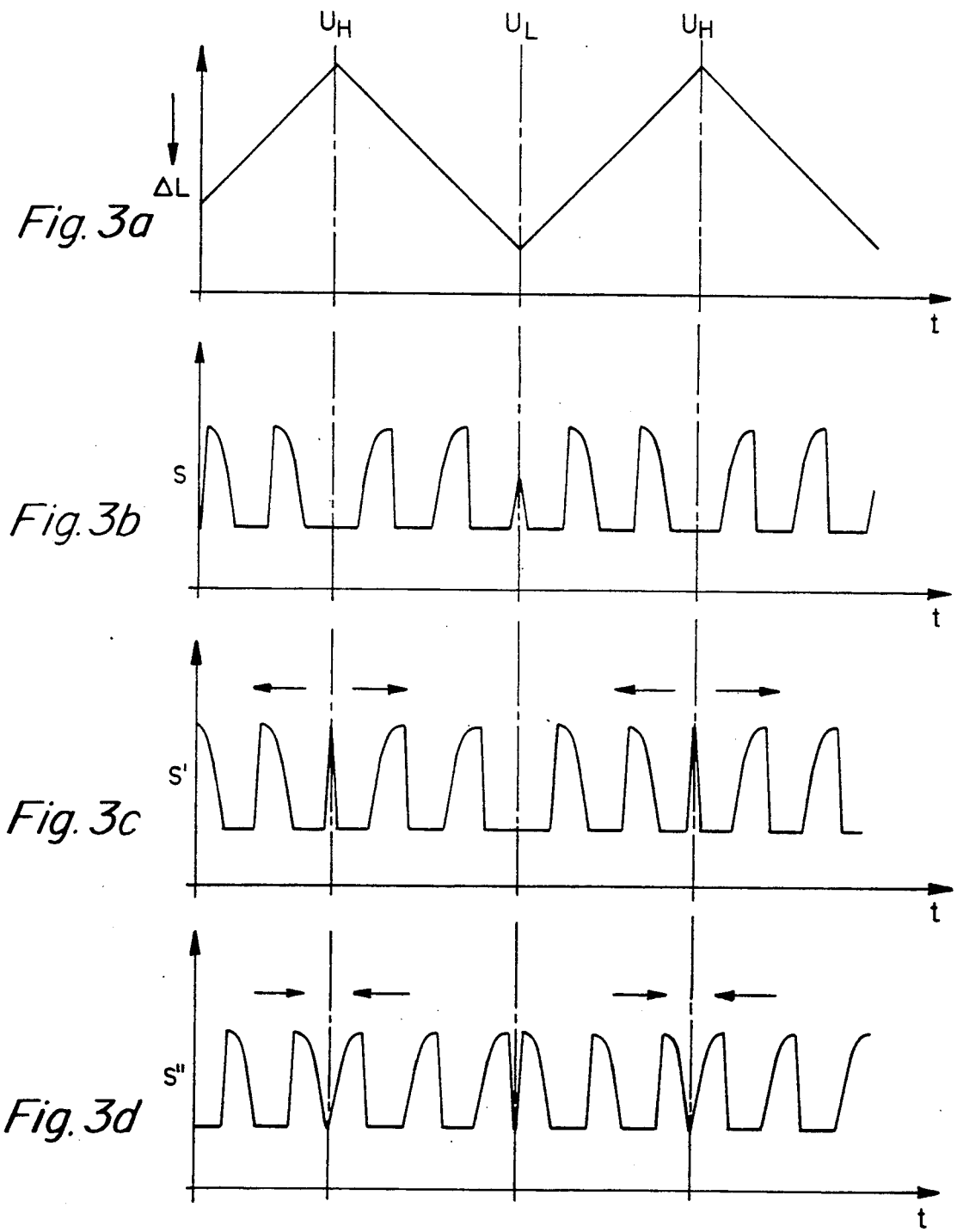

LASER SENSOR WITH EXTERNAL RESONANCE CAVITY

Cross-Reference to related patents, the disclosure of which are hereby incorporated by reference:
U.S. Pat. No. 4,583,227, KIRKBY/ITT=EP 090 485=DE 33 03 566;
U.S. Pat. No. 4,773,077, YAMAMOTO/SHARP=EP 206 745;
U.S. Pat. No. 4,806,778, YAMAMOTO/SHARP=DE 36 06 090;
U.S. Pat. No. 4,829,531, KAWANISHI/SHARP=EP 257 898;
U.S. Pat. No. 4,803,695, YAMAMOTO/SHARP=EP 206 661;
U.S. Pat. No. 4,803,692, SAKANO/HITACHI=EP 213 965;

CROSS-REFERENCE TO RELATED PATENT DOCUMENT

EP 140 820=DE 33 30 434, GROSSKOPF/HEINRICH-HERTZ-INSTITUTE.

CROSS-REFERENCE TO RELATED PUBLICATIONS

Journal of Lightwave Technology, Vol. LT-1, No. 1., March 1983, article by R.O. Miles et al. on pages 81–93;
Journal of Lightwave Technology, Vol. 6, No. 10, Oct. 1988, article by E.M. Strzelecki et al. on pages 1610–1618.

FIELD OF THE INVENTION

The invention relates generally to a laser sensor with an external resonator whose length L is defined by the position of an external reflector R and, more particularly, to a method of measuring several different system parameters by evaluation of the signal representing the measured intensity of the laser's output beam.

Light emitted from the laser traverses the external resonator and is reflected back into the laser, so that the conditions, or change in conditions, in the external resonator cause changes in the light generation within the laser and thus one can measure those conditions by observing what happens to light generation in the laser. Parameters which one can measure include the change in length L of the external resonator, deviation of the angle of the external reflector with respect to the longitudinal optical axis of the laser (particularly whether the reflector surface is normal to the optical axis), and change in the refractive index of the medium which occupies the space defined by the external resonator and through which the laser beam passes.

BACKGROUND OF THE INVENTION

Lasers, particularly semiconductor lasers with external resonators, are known for use as transmitters for various technical systems, including length and angle measurement systems and interferometers. See, for example, the above noted U.S. Pat. Nos. and corresponding European Patents 90 485, 140 820, 206 661, 206 745, 213 965, and 257 898. In these systems, the function of the external resonator is to control the transmission characteristics of the laser.

It has also known to modulate such laser systems; see for example, the article of E.M. Strzelecki et al. in "Journal of Lightwave Technology", Vol. 6, No. 10, Oct. 1988, pages 1610–1618, where a modulated laser beam for a LIDAR distance measuring apparatus is generated. LIDAR is an acronym for LIght Detection And Ranging, analogous to RADAR, RAdio Detection And Ranging.

However, in all these systems, the laser is the transmitter and the measuring apparatus is a separate unit, so that feedback of the laser beam into the laser is not used for measurement purposes.

R.O. Miles et al. "Journal of Lightwave Technology", Vol. LT-1, No. 1., March 1983, pages 81–9.3, describe a system in which the laser with external resonator is itself used as a sensor and in which one observes the feedback effect of the external resonator on the laser, in dependence upon the parameters to be measured. On page 85 thereof, one sees how, for example, modification of the length of the external resonator leads to periodic fluctuations in the intensity of the light emitted from the laser. However, from observing these fluctuations, one cannot detect the direction of the change in length, so that one does not know whether the external resonator has become longer or shorter or whether, in the worst case, the external reflector is merely vibrating about a rest position and thereby generating intensity fluctuations which are mistaken for a continuous movement. With sensitivities in the nanometer range, this is often the case. Such characteristics severely limit the practical applicability of such sensors. Further, heretofore, only length change and angular tilting has been measured with external resonators.

YAMAMOTO/SHARP U.S. Pat. No. 4,806,778 and corresponding German Patent Disclosure DE-OS 36 06 090 disclose, in FIG. 2, a characteristic direction-dependent signal form of the periodic intensity fluctuations, but this disclosure does not suggest evaluating this signal for direction detection; rather, an amplitude offset is evaluated.

SUMMARY OF THE INVENTION

Accordingly, it is an object of the present invention, taking the aforementioned disclosures as a point of departure, to overcome their disadvantages and limitations in order
(1) to enable detection of direction of change of the parameters to be measured, including a change in length of the external resonator, angular tilting of the external reflector with respect to the optical axis and change in refractive index of the medium in the external resonator,
(2) to increase the resolution, stability and adjustability of the sensor, and
(3) to permit use, as external reflectors, of not only optical elements, but also other reflective surfaces.

Briefly, the method of the present invention generates a signal by measuring the fluctuations in the laser beam intensity and evaluates that signal to determine the direction of change of a selected parameter. Further, modulation of the laser system, consisting of the laser and external resonator, can be used so that measurement of the time or phase shifting of the light intensity fluctuations, with respect to the modulation signal, can be used to determine the measured parameter and its direction of change.

Thus, a novel feature of the invention is the detection of direction of change of the measured parameters by evaluation of the form of the resulting signals. Another novel feature is modulation of the laser system, not only by incremental modulation of the parameters to be measured, e.g. length, but also by other system-influencing parameters, e.g. the pumping energy, particularly the pumping current I. Other great advantages of modulation will be described below.

DRAWINGS

FIG. 3a–3d illustrates a sawtooth or triangular modulation of length L, the resulting pulses in s, and the shifting of the with respect to the modulation signal;

DETAILED DESCRIPTION

Figure 1:
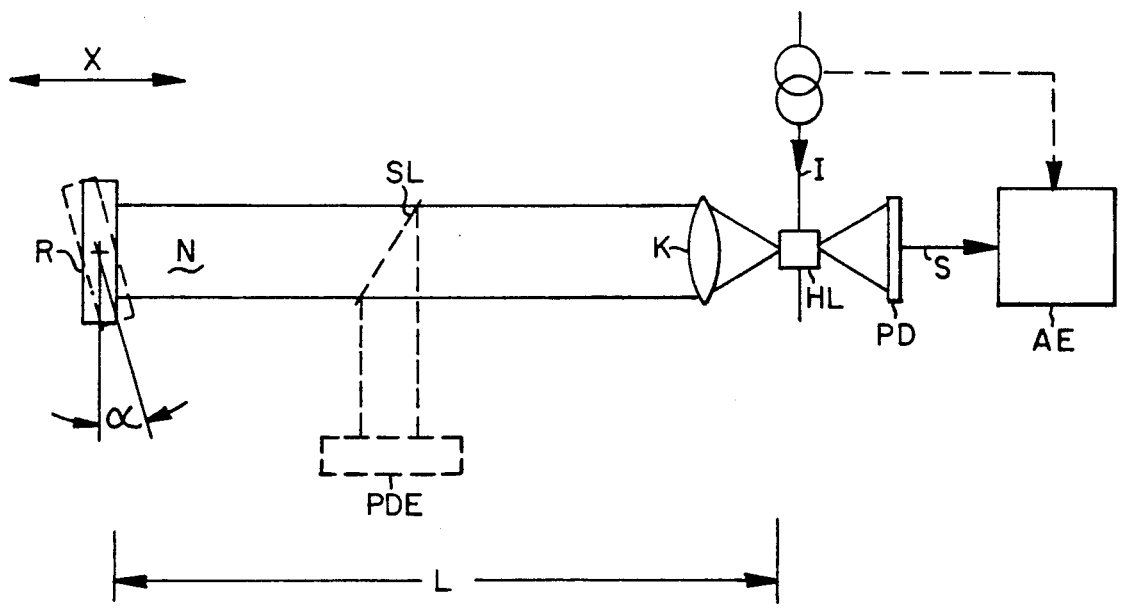
FIG. 1 illustrates schematically the structure of the laser sensor of the present invention for measuring length L and tilt angle α.

FIG. 1 illustrates a first embodiment of the invention. A laser, here a semiconductor laser HL, is pumped with a current I and radiates, in the usual manner, light of wavelength λ from its front and back facets as soon as current I exceeds the so-called lasing threshold. As the laser, one can use, for example, the commercially available laser diodes SHARP model nos. LT 30 or LT 26, or PHILIPS model CQL 20, which have a photodiode PD integrated in the housing. The beam at the front facet is collected by a collimator K. Suitable devices include commercially available collimators, microscope objectives or convex lenses with the least possible beam spreading. The outlet channel of the laser is positioned at the focal point of the collimator, so that the laser beam will be as well parallelized as possible. The use of a single lens has proved to be more advantageous than the use of multiple lens systems. This parallelized beam strikes a reflector R, which may be a simple mirror, and is reflected back from the mirror through the collimator K into the laser; to this end, reflector R must be aligned so that it is perpendicular to the optical axis of the device.

The intensity of the laser-generated light is measured by a photodiode PD which is in the beam path of the rearwardly emitted laser light. The signal from the photodiode is fed for evaluation purposes to an evaluation unit AE. The light intensity of the laser can also be measured with a beam splitter SL and a photodiode PDE, as shown by dash lines in FIG. 1 and fed from there to evaluation unit AE. It is equally possible to use, as reflector R, a photodiode whose surface is reflective and to thereby measure the light intensity of the laser.

In the following discussion, the term "laser system" refers to an arrangement consisting of a semiconductor laser HL and external resonator, a space N and a reflector R, with or without a collimator K. In such a system, the following effects, among others, occur: if one sets a constant current I so that the semiconductor laser HL operates in the lasing region, and slides reflector R along the optical axis a distance dX, one will find fluctuations in the light intensity of HL, i.e. in signal S. With corresponding adjustment of the apparatus and of current I, clearly recognizable pulses occur whenever reflector R is shifted by a distance corresponding to the half wavelength of the emitted laser light.

This effect permits construction of an incremental laser measurement system which measures distances on the order of several centimeters. More precise investigations reveal that the spacing of the impulses also depends upon the refractive index n of the medium in which the space N, traversed by the laser beam, of the external resonator is located.

Likewise, pulses result upon tilting of reflector R out of the position perpendicular to the optical axis and upon variation of current I.

However, such a system is practically useful only once one can recognize, in the output signal, what the direction of change of reflector R or of refractive index N is.

Figure 2A:
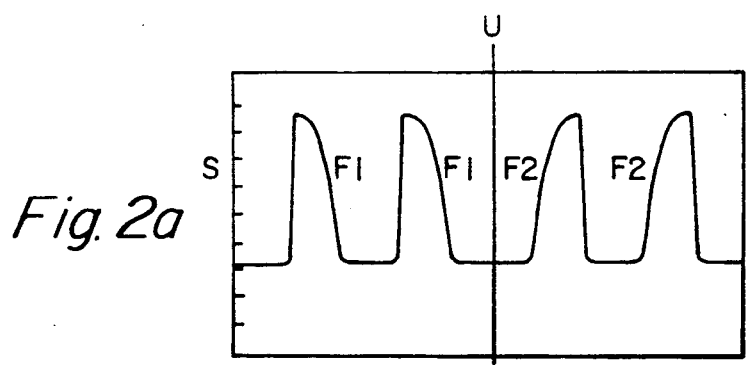
FIG. 2 illustrates the pulse-like light intensity fluctuations which occur in signal s when length L varies.
Figure 2B:
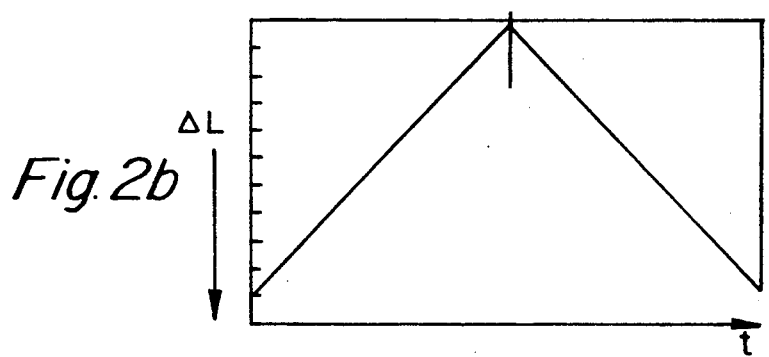

For this purpose, the present invention provides two methods, the basis of the first of which is illustrated in FIG. 2. If one adjusts the apparatus with the aforementioned semiconductor laser as described above, and sets current I to the level of the semiconductor laser threshold, or below, so that pulses occur at S as shown in FIG. 2(a), one finds that the pulses F1 which occur upon reduction in resonator length L have a different form than the pulses F2 which occur upon increase in resonator length L.

This is caused by hysteresis effects in the laser and they occur particularly at the lower boundary of the lasing region. One can distinguish the pulses, for example by differentiation of signal S in the evaluation unit AE, and one can thereby determine the direction of the effect. The precondition for this method is, however, that the reflector R, refractive index N or angle α do not change to slowly, since otherwise the stability of the system becomes too poor.

Modulation of the laser system provides substantial advantages in terms of direction detection, stability and resolution of the laser sensor and this opens new possibilities for practical use of such a system.

FIG. 3 illustrates the modulation of a parameter which is itself to be measured, in this example the length L. Here the length L is continuously varied with a piezo adjustment element, for example in a sawtooth pattern.

FIG. 3a illustrates the voltage on the piezo adjustment element as a measure of the modulation of L. There arise continuous pulses in output signal s, whenever the reflector is displaced by at least one half wave length of the laser.

The modulation of L therefore provides a fixed time scale, defined by the High and Low direction or slope reversal points $U_H$ and $U_L$ or the rising and falling flanks of the sawtooth modulation signal. Assuming that the laser system is not modified, apart from the modulation, there arise pulses in signal s, as shown in FIG. 3b, always at the same position with respect to the sawtooth length change.

However, if one moves reflector R toward the semiconductor laser, pulses as shown in FIG. 3c are generated from the higher reversal point $U_H$ to the lower reversal point $U_L$ and disappear there, while new pulses arise at $U_H$. This is readily explainable, since the rising part of the modulation voltage corresponds to a shortening dL of the external resonator, which is amplified by the movement of reflector R toward the semiconductor laser, so that the pulses arrive sooner.

The lengthening of the external resonator in the falling portion of the modulation of FIG. 3a is delayed, by the drawing together of reflector R and semiconductor laser HL, so that the pulses here arrive later with respect to the sawtooth.

If one moves reflector R away from semiconductor laser HL, this causes the effect shown in FIG. 3(d), which is the reverse of the effect shown in FIG. 3(c). The pulses are shifted away from point $U_L$ toward point $U_H$ and disappear there.

If one counts the number of the vanished or created pulses at the reversal points, or the number and direction of the pulses passing specific marks N within a modulation period, one can determine the direction and distance that reflector R has shifted, since one knows that the interval between two pulses corresponds to a shift of a half laser wavelength (neglecting the influence of refractive index n in N).

The resolution from pulse to pulse thus approximates a half laser wavelength, for example 380 nanometers in the SHARP model LT 30. If one goes so far as to measure the shifting of individual pulses within the modulation interval between the reversal points, the resolution increases even further.

Modification of the length L, of the angle $\alpha$, of the refractive index n and of current I as a result of an effect to be measured or of an intentional modulation have a similar influence, namely the generation of pulses. The modulation for measurement of L, $\alpha$, and of n can also be carried out by periodic modification of all four of the aforementioned parameters.

Figure 4A:
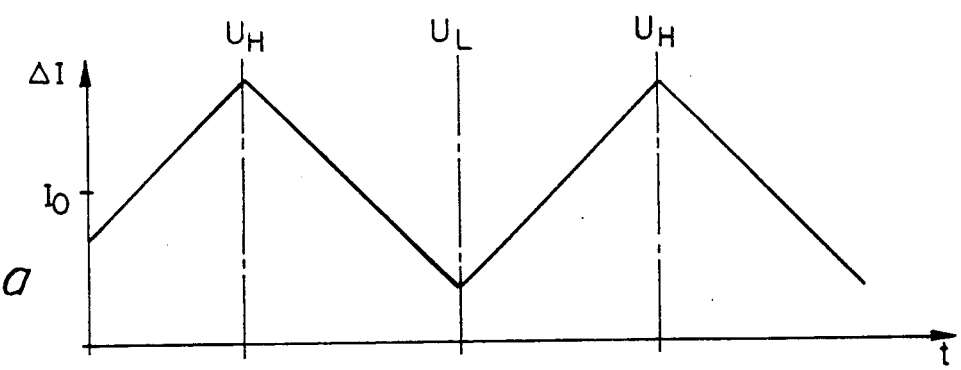
FIG. 4a–4b illustrates the sawtooth modulation of pump current I, and the resulting signal s.
Figure 4B:
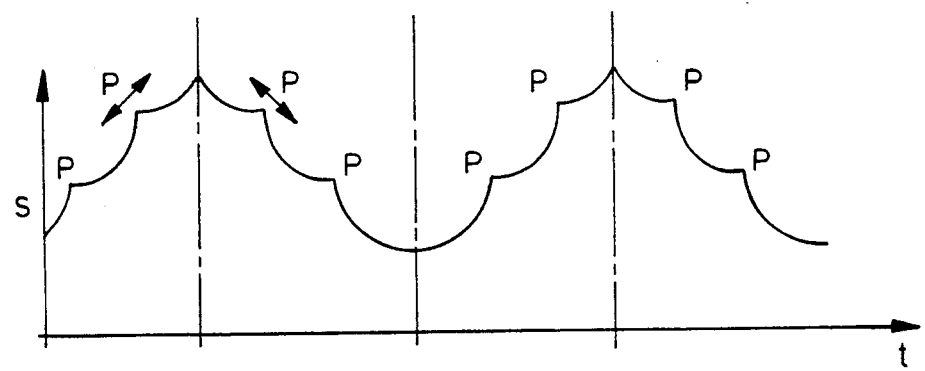

The modulation of current I for length measurement purposes is shown in FIG. 4. The modulation itself may be seen in signal s, since the current I itself influences the light intensity. The modulation period can thus be derived from the photodiode signal and need not be transmitted itself to the evaluation unit, as in length modulation of the modulator. The shifting of pulses P in FIG. 4b corresponds exactly to that in FIG. 3, and their evaluation can be carried out as described above.

Measurement of Refractive Index

Figure 5:
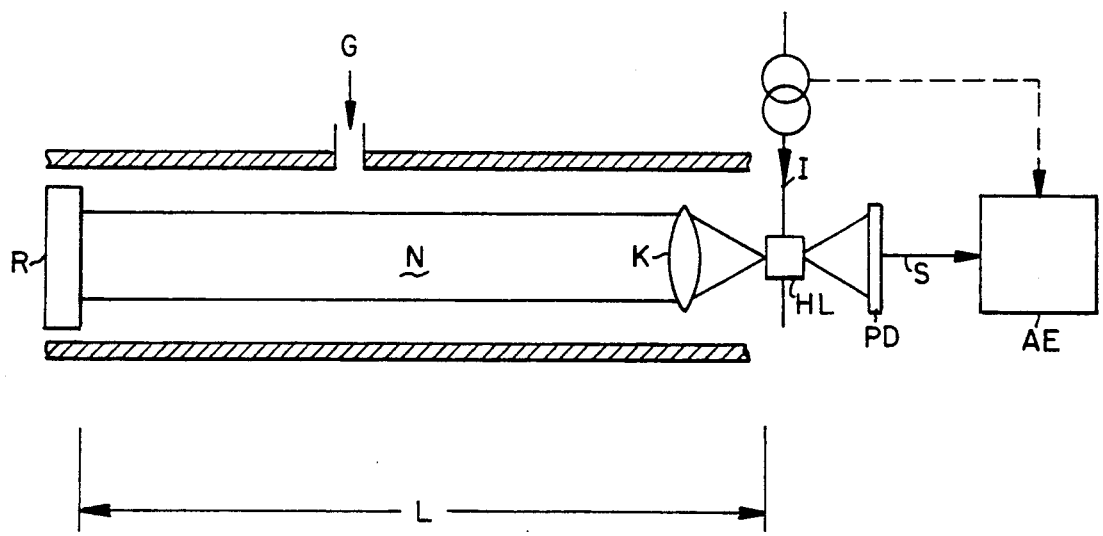
FIG. 5 illustrates the structure of a laser sensor for measurement of the refractive index n in space N.

Exactly the same image, as shown in FIG. 4, with the same shifting of pulses, results if one, as shown in FIG. 5, leaves reflector R at rest and instead modifies the refractive index n in the external resonator. This can be carried out, for example, if the external resonator is surrounded by a tube and is flooded with a gas ($CO_2$). Upon transition at G from air to $CO_2$, one can, given a resonator length L of 12 centimeters, observe 16 pulses passing. The direction of the transition, from air to $CO_2$ and the reverse, is unambiguously recognizable in the shift direction of the pulses. The measurement effect thus described is adapted for use in the analysis of gases, fluids and solid bodies having a refractive index.

Auto Collimator

Figure 6:
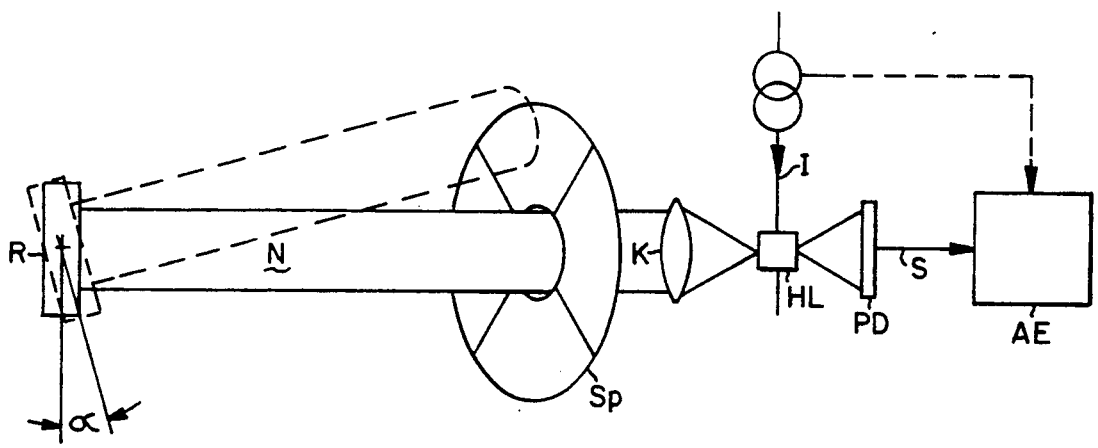
FIG. 6 illustrates the use of the laser sensor as an auto-collimator.

If a set of optics or apparatus for parallelization or beam direction reversal is to be aligned, the structure shown in FIG. 6 is suitable for this purpose. Reflector R is replaced by the object to be aligned and is adjusted until the maximal feedback of the beam into the laser occurs. Then the aligned object will be orthogonal to the optical axis, both in the plane of the drawing and in the plane extending from the optical axis, perpendicular to the plane of the drawing. The angle $\alpha$ and the tilt angle, perpendicular to the drawing plane, corresponding thereto (not shown in FIG. 6) are both then exactly zero. This is achieved by adjusting both angles so that the pulses of FIG. 3 or FIG. 4, respectively, are at the point or position of reversal of shift direction. The coarse adjustment, for when the returning laser beam does not penetrate the laser at all, can be carried out by a segmented photodiode with a central aperture Sp.

The modulation of the laser system offers great advantages for the stability of the system. Practical construction efforts have made this clear. Hysteresis effects, and the rapid traversal of operating points, tend to cause chaotic vibrations of the laser, which theory can explain but which disclosures often interpret as noise. Improved stability increases the practical applicability of the sensor. Further, the alignment of the system is made substantially easier since pulses always occur, leaving aside the measurement effects. The advantages are at their greatest when one modulates the current I, since this modulation can be very rapid and extend even into the GigaHertz (GHz) range and a very rapid length- or refractive-index-measurement device can be constructed.

EXAMPLES

In the case of current modulation, the alignment steps are as follows:

One increases the constant component of current I until the modulation, e.g. the sawtooth shown in FIG. 4, is measurable in the signal s; this means the lasing region has been reached; then one aligns the collimator K so that the laser beam is parallel within itself and with respect to the optical axis.

The reflector R is coarsely aligned until the returning laser beam penetrates the laser and then fine adjustments are made until the pulses P shown in FIG. 4 occur.

Thereafter, it is possible to readjust the constant component of the current I to improve the pulse form; this depends upon the particular laser used and is in the range just over or under the lasing threshold of the particular laser.

The fact that the laser sensor, as here described, actually operates below the lasing threshold current of the particular laser shows that the external resonator effectively functions and couples energy back into the laser.

The temperature sensitivity of the semiconductor laser can be minimized by adjustments to pumping current I at regular intervals in accordance with parameters of the current/light output or current/voltage characteristic curves, the resistance or differential resistance of the semiconductor laser chip or of the photodiode PD, which are temperature-dependent.

Instead of measuring the passage of pulses or the shifting of pulses with respect to the modulation, it is also possible to compensate for the effect measured by a supplemental modification of the current I, that is, to regulate I so that the pulses in signal s always occur at the same position within the modulation interval. One can then derive, from the supplemental modification of I, the parameter being measured, as an analog signal.

In this application of the present invention as in all other applications, the collimator K for focussing of the laser beam can be omitted, if the reflector R or the other object reflecting the laser beam is located close enough to the laser and if the requirements for precision are not very high. This opens the possibility of very simple, compact and cost-effective sensors.

Various changes and modifications are possible within the scope of the inventive concept.

I claim:

1. Method of measuring a change in a laser system, said laser system including a laser (HL), having an optical axis, for emitting a beam;

an external resonator, spaced from said laser by a volume (N) filled with a medium of refractive index n, and having a reflector (R) in a path of said beam, and means for tilting said reflector with respect to said optical axis, and means (PD) for measuring intensity of said beam and for generating a signal representative of said intensity, said change relating to one of the following parameters of said system:

length (L) of said external resonator, angle (α) of said reflector with respect to said axis; or refractive index n in said external resonator, said method comprising the steps of inducing lasing in said laser;

reflecting said beam emitted by said laser off said reflector back into the laser, and causing periodic fluctuations in light intensity upon monotonic change in one of the aforementioned parameters, defined as the observed parameter, and evaluating a characteristic, direction-dependent form of said signal to thereby detect direction of change in said measured or observed parameter.

2. Method according to claim 1, including the step of modulating a parameter selected from the group consisting of said length L, said angle, said refractive index n, and laser pumping energy.

3. Method according to claim 2, wherein said modulation is a periodic modulation.

4. Method according to claim 3, wherein said modulation is a sawtooth modulation.

5. Method according to claim 2, wherein said selected parameter is the same as a parameter to be observed.

6. Method according to claim 2, wherein said selectee parameter is a parameter other than a parameter to be observed.

7. Method according to claim 3, including the step of detecting how much a parameter being observed has changed.

8. Method according to claim 4, wherein including the step of detecting how much a parameter being observed has changed.

9. Method according to claim 2, including the step of controlling feedback regulation of changes in the measured parameter itself as a function of the shift, with respect to the monotonic change, in a light intensity fluctuations, caused by the measured parameter.

10. Method according to claim 1, further comprising the steps of compensating for laser-light intensity fluctuations by changing pumping energy applied to the laser, and deriving from changes in said pumping energy signals representing direction and magnitude of change in at least one of resonator length L, reflector angle, and refractive index of a medium within said resonator.

11. Laser system for carrying out the method of claim 1, having a laser with an external resonator and a photosensor, wherein said laser has a front facet adjacent said external resonator and a rear facet adjacent said photosensor, said photosensor measuring intensity of light emitted from said rear facet.

12. Laser system according to claim 11, wherein said laser and photosensor are enclosed within a common housing.

13. Laser system for carrying out the method of claim 1, wherein said reflector is coated with a photosensitive layer for measuring light intensity of said laser.

14. Laser system for carrying out the method of claim 1, wherein the reflector is a photodiode which measures intensity of light emitted by said laser.

15. Laser system for carrying out the method of claim 1, wherein the reflector contains a retro-reflector.

16. Laser system according to claim 9, wherein the reflector contains a retro-reflector.

17. Method according to claim 1, further comprising the step of collimating the beam emitted by said laser toward said reflector.

18. Apparatus according to claim 11, further comprising a collimator aligned with the optical axis of said laser.

19. Method according to claim 17, wherein said step of collimating renders the laser beam parallel.

20. Apparatus for carrying out the method of claim 1, comprising a beam splitter located in an output beam of said laser and directing a portion of said beam onto a photosensor.

21. Apparatus for carrying out the method of claim 1, wherein said laser is a semiconductor laser.

22. Laser system for carrying out the method of claim 1, wherein said laser is a current-pumped laser.

* * * * *